(12) United States Patent
Mojumder et al.

(10) Patent No.: US 9,336,864 B2
(45) Date of Patent: May 10, 2016

(54) SILICON GERMANIUM READ PORT FOR A STATIC RANDOM ACCESS MEMORY REGISTER FILE

(71) Applicant: QUALCOMM Incorporated, San Diego, CA (US)

(72) Inventors: Niladri Mojumder, San Diego, CA (US); Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/473,974

(22) Filed: Aug. 29, 2014

(65) Prior Publication Data

US 2016/0064068 A1  Mar. 3, 2016

(51) Int. Cl.
| | |
|---|---|
| *G11C 11/00* | (2006.01) |
| *G11C 11/419* | (2006.01) |
| *G11C 11/405* | (2006.01) |
| *G11C 11/409* | (2006.01) |

(52) U.S. Cl.
CPC ............ *G11C 11/419* (2013.01); *G11C 11/405* (2013.01); *G11C 11/409* (2013.01)

(58) Field of Classification Search
CPC ... G11C 11/405; G11C 11/409; G11C 11/419
USPC ................ 365/154, 156, 230.05, 189.15, 203
See application file for complete search history.

(56) References Cited

U.S. PATENT DOCUMENTS

| | | | |
|---|---|---|---|
| 6,005,794 A * | 12/1999 | Sheffield | G11C 11/419 |
| | | | 365/154 |
| 6,856,030 B2 | 2/2005 | Madurawe | |
| 6,888,778 B2 | 5/2005 | Terzioglu et al. | |
| 7,166,904 B2 | 1/2007 | Gill et al. | |
| 7,787,284 B2 | 8/2010 | Chan et al. | |
| 8,395,937 B2 | 3/2013 | Fisch et al. | |
| 8,735,987 B1 | 5/2014 | Hoffmann et al. | |
| 2002/0179946 A1* | 12/2002 | Hara | H01L 29/1054 |
| | | | 257/288 |
| 2008/0117665 A1* | 5/2008 | Abeln | G11C 11/419 |
| | | | 365/154 |
| 2008/0123462 A1 | 5/2008 | Liaw | |
| 2009/0303821 A1* | 12/2009 | Arsovski | G11C 7/12 |
| | | | 365/203 |
| 2013/0170288 A1* | 7/2013 | Kohli | G11C 11/412 |
| | | | 365/156 |
| 2014/0153323 A1 | 6/2014 | Liaw | |

OTHER PUBLICATIONS

Franco, J. et al., "Reliability of SiGe Channel MOS," 2012 ECS Conference, No. C, p. 3119.

Manohara S., Prashanth Sai, et al., "Design and Implementation of Optimized Dual Port Register File Bit Cell," International Journal of Scientific and Research Publications, vol. 3, Iss. 11, Nov. 2013, 6 pages.

(Continued)

*Primary Examiner* — Tan T Nguyen
(74) *Attorney, Agent, or Firm* — Toler Law Group (57) ABSTRACT

A static random access memory (SRAM) circuit includes a write port and a read port coupled to the write port. The read port includes a read bit line and a first p-type metal oxide semiconductor (PMOS) transistor having a silicon germanium (SiGe) channel. The read port also includes a second PMOS transistor having a second SiGe channel, where the second PMOS transistor is coupled to the first PMOS transistor.

27 Claims, 6 Drawing Sheets

(56) References Cited

OTHER PUBLICATIONS

Agrawal, V. et al., "Low Power ARM TM Cortex(TM)-M0 CPU and SRAM Using Deeply Depleted Channel (DDC) Transistors with VDD Scaling and Body Bias", IEEE Custom Integrated Circuits Conference (CICC), 2013, 4 pages.

Geuskens, B. et al., "Opportunities for PMOS Read and Write Ports in Low Voltage Dual-Port 8T Bit Cell Arrays", IEEE Custom Integrated Circuits Conference (CICC), 2010, 4 pages.

International Search Report and Written Opinion—PCT/US2015/041676—ISA/EPO—Oct. 2, 2015.

* cited by examiner

SILICON GERMANIUM READ PORT FOR A STATIC RANDOM ACCESS MEMORY REGISTER FILE

I. FIELD

The present disclosure is generally related to a silicon germanium read port for a static random access memory register file.

II. DESCRIPTION OF RELATED ART

Advances in technology have resulted in smaller and more powerful computing devices. For example, there currently exist a variety of portable personal computing devices, including wireless telephones such as mobile and smart phones, tablets, and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones may include register files to store data values (e.g., bits) used for applications. For example, wireless telephones may implement integrated circuit (IC) register files using static random access memory (SRAM) registers files having multiple ports (e.g., a read port and a write port). A SRAM register file may be scaled to different technologies. For example, a SRAM register file may be scaled to 14 nanometer (nm) complementary metal oxide semiconductor (CMOS) technologies and below. Scaling SRAM register files to smaller technologies may reduce channel lengths of transistors in the SRAM register files. However, when 8-transistor (8T) SRAM register files or 10-transistor (10T) SRAM register files are scaled down to smaller technologies, sensing operations (e.g., read operations) may take longer because of a "rail-to-rail" voltage swing. For example, in order to sense a data value at a read port, a bit line (e.g., a read bit line) may be discharged from a supply voltage to ground (e.g., a rail-to-rail discharge). The rail-to-rail discharge may be time consuming for transistors with reduced channel lengths.

III. SUMMARY

Techniques and methods to improve sensing operations for static random access memory (SRAM) register files are disclosed. A SRAM register file may include a write port and a read port. The write port may store a data value in a latch (e.g., a pair of cross-coupled inverters). For example, the write port may store a logical high voltage level (e.g., a logical "1") or a logical low voltage level (e.g., a logical "0") in the latch. The read port may include a pair of p-type metal oxide semiconductor (PMOS) transistors having silicon germanium (SiGe) channels. For example, the read port may include a first PMOS transistor (e.g., a pass gate) having a SiGe channel coupled to a second PMOS transistor having a second SiGe channel. A gate of the first PMOS transistor may be coupled to a read word line and a source of the first PMOS transistor may be coupled to a read bit line. A source of the second PMOS transistor may be coupled to a drain of the first PMOS transistor, and a drain of the second PMOS transistor may be coupled to ground.

During a read operation (e.g., a sensing operation), the read port detects whether the data value stored in the latch represents a logical "0" data value or a logical "1" data value. For example, a gate of the second PMOS transistor may be coupled to the latch, the read bit line may be pre-charged to a logic high voltage level, and the read word line may be coupled to ground (e.g., a logic low voltage level) to turn on the first PMOS transistor. If the data value stored in the latch is a logical "1", the second PMOS transistor may inhibit conduction and the read bit line remains in a pre-charged state. If the data value stored in the latch is a logical "0", the second PMOS transistor may conduct and the read bit line is discharged. The SiGe channels of the PMOS transistors may enable the read bit line to discharge at a faster rate compared to silicon channel n-type metal oxide semiconductor (NMOS) transistors.

In a particular aspect, a static random access memory (SRAM) circuit includes a write port coupled to a read port. The read port includes a read bit line and a first p-type metal oxide semiconductor (PMOS) transistor having a silicon germanium (SiGe) channel. The read port also includes a second PMOS transistor having a second SiGe channel, where the second PMOS transistor is coupled to the first PMOS transistor, and where the first PMOS transistor and the second PMOS transistor are configured to discharge the read bit line.

In another particular aspect, a method includes storing a data value into a latch. The method also includes sensing the data value at a read port of a static random access memory (SRAM) circuit. The read port includes a first p-type metal oxide semiconductor (PMOS) transistor having a silicon germanium (SiGe) channel and a second PMOS transistor.

In another particular aspect, a non-transistor computer-readable medium includes instructions that, when executed by a processor, cause the processor to store a data value into a latch. The instructions are also executable to cause the processor to sense the data value at a read port of a static random access memory (SRAM) circuit. The read port includes a first p-type metal oxide semiconductor (PMOS) transistor having a silicon germanium (SiGe) channel and a second PMOS transistor.

In another particular aspect, a static random access memory (SRAM) circuit includes means for storing data and means for sensing data coupled to the means for storing data. The means for sensing data includes a read bit line and a first p-type metal oxide semiconductor (PMOS) transistor having a silicon germanium (SiGe) channel. The means for sensing data also includes a second PMOS transistor coupled to the first PMOS transistor.

One particular advantage provided by at least one of the disclosed aspects is improved rail-to-rail discharge during sensing operations for multi-port register files. For example, the SiGe channels in the PMOS transistors of the read port may increase carrier mobility (compared to silicon channel NMOS transistors). The increased carrier mobility accelerates the discharge rate for multi-port register files. Other aspects, advantages, and features of the present disclosure will become apparent after review of the entire application, including the following sections: Brief Description of the Drawings, Detailed Description, and the Claims.

V. DETAILED DESCRIPTION

Figure 1:
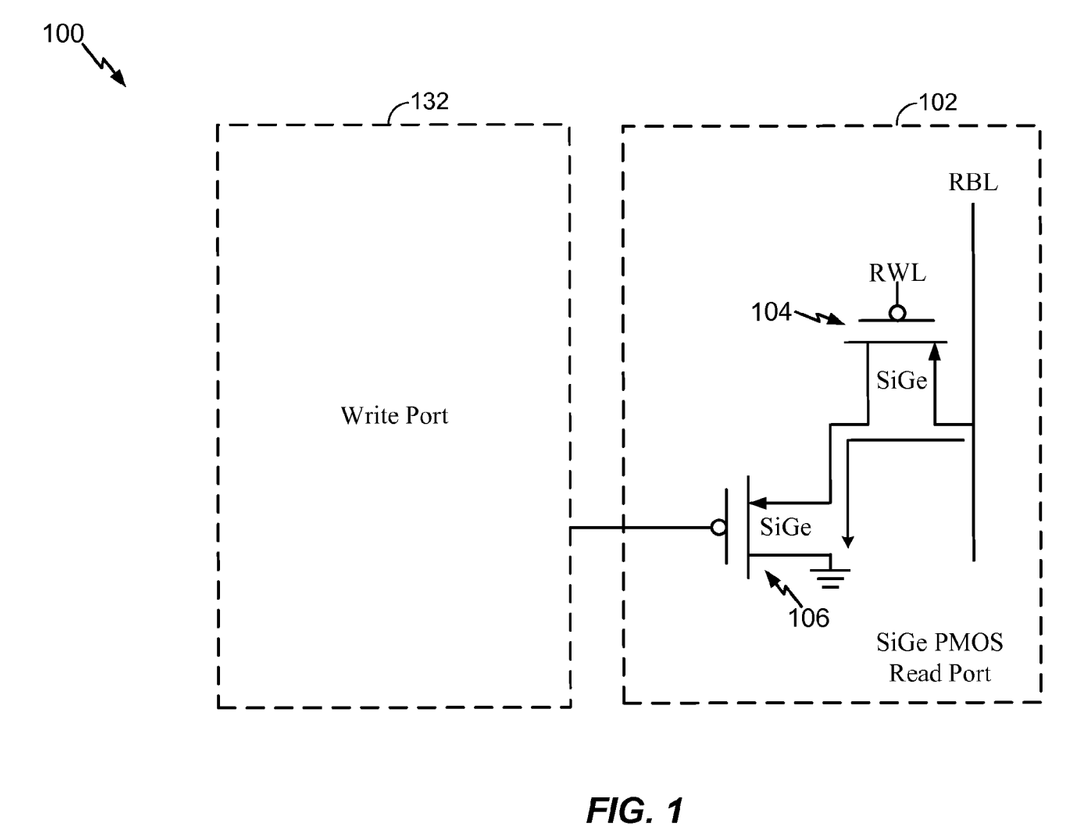
FIG. 1 is a diagram of a particular illustrative aspect of a static random access memory (SRAM) register file that includes a silicon germanium read port.

Referring to FIG. 1, a particular illustrative aspect of a static random access memory (SRAM) register file 100 that includes a silicon germanium read port is shown. In a particular aspect, the SRAM register file 100 may correspond to an 8-transistor (8T) SRAM register file (e.g., an 8T bit cell). The SRAM register file 100 may include a write port 132 coupled to a read port 102.

Figure 2:
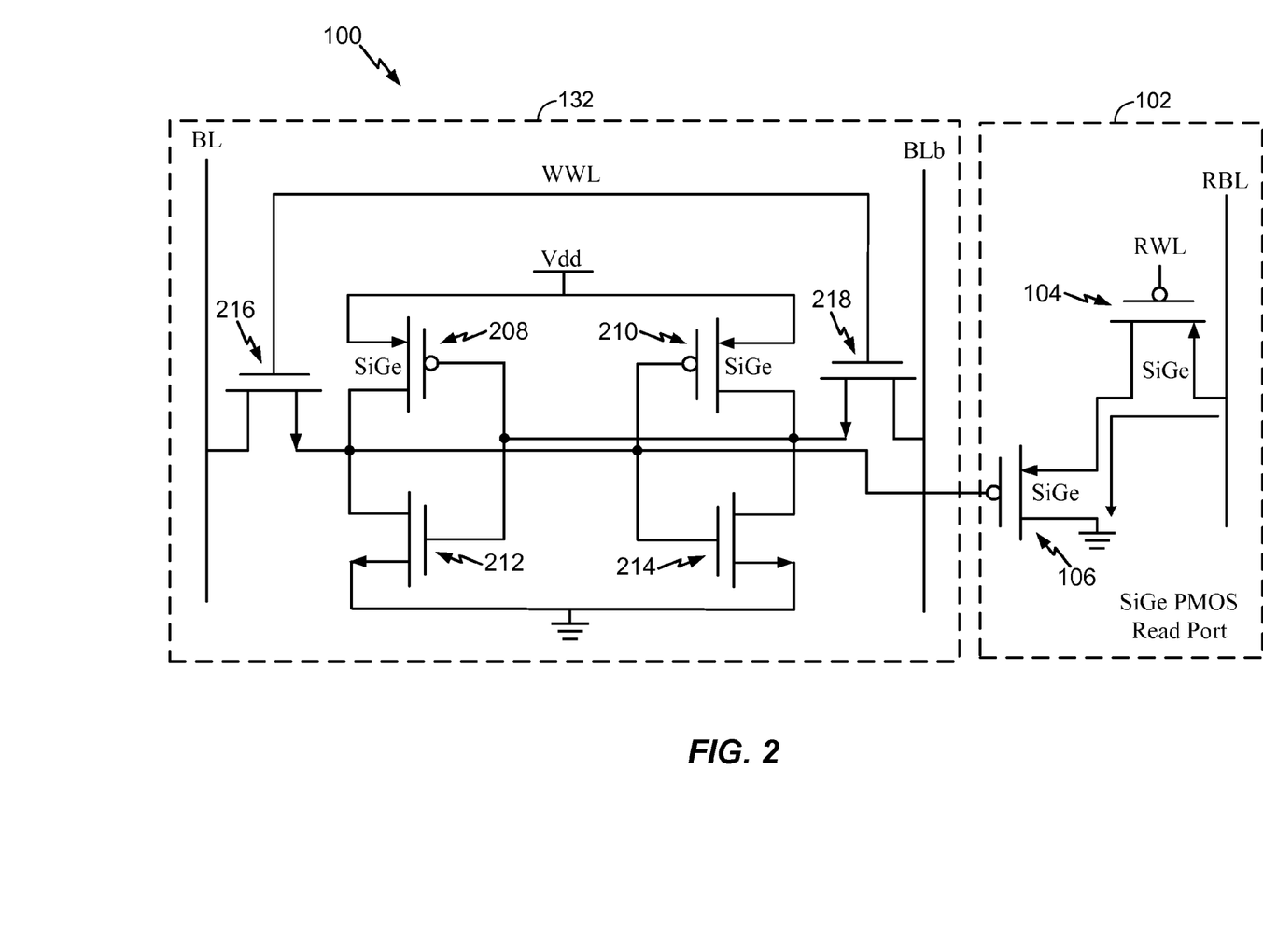
FIG. 2 is a diagram of another particular illustrative aspect of the SRAM register file of FIG. 1.

The write port 132 may include a pair of cross-coupled inverters (e.g., a latch), as described with respect to FIG. 2, to store a data value. For example, the write port 132 may store a data value having a logic low voltage level (e.g., a logical "0" data value) or a data value having a logic high voltage level (e.g., a logical "1" data value).

The read port 102 may be configured to read (e.g., sense) the data value stored at the write port 132. In a particular aspect, the read port 102 may be a silicon germanium (SiGe) p-type metal oxide semiconductor (PMOS) read port. For example, the read port 102 may include a PMOS transistor 104 (e.g., a pass gate) having a SiGe channel coupled to another PMOS transistor 106 having a SiGe channel. A gate of the PMOS transistor 104 may be coupled to a read word line (RWL) and a source of the PMOS transistor 104 may be coupled to a read bit line (RBL). A source of the PMOS transistor 106 may be coupled to a drain of the PMOS transistor 104, and a drain of the PMOS transistor 106 may be coupled to ground.

During a read operation (e.g., a sensing operation), the read port 102 may be configured to sense whether the data value stored in the write port 132 (e.g., the data value stored in the latch) represents a logical "0" data value or a logical "1" data value. For example, a gate of the PMOS transistor 106 may be coupled to the write port 132, the read bit line (RBL) may be pre-charged to a logic high voltage level, and the read word line (RWL) may be coupled to ground (e.g., a logic low voltage level) to turn on the PMOS transistor 104.

If the data value stored in the latch of the write port 132 is a logical "1" (e.g., a logic high voltage level is provided to the gate of the PMOS transistor 106), the PMOS transistor 106 may inhibit conduction and the read bit line (RBL) remains in a pre-charged state (e.g., the read bit line (RBL) is not discharged). If the data value stored in the latch of the write port 132 is a logical "0" (e.g., a logic low voltage level is provided to the gate of the PMOS transistor 106), the PMOS transistor 106 may conduct and the read bit line (RBL) is discharged.

The SRAM register file 100 of FIG. 1 may improve single ended read performance compared to a conventional SRAM register file due to higher read current in SiGe PMOS read port devices. For example, the PMOS transistors 104, 106 (e.g., SiGe channel transistors) may have increased carrier mobility as compared to an SRAM register file having silicon channel n-type metal oxide semiconductor (NMOS) transistors. For example, the carrier mobility of the PMOS transistors 104, 106 may be approximately 10% to 20% higher than the carrier mobility of the silicon channel NMOS transistors. The increased carrier mobility of the PMOS transistors 104, 106 enables the read bit line (RBL) to discharge from the "pre-charged" level (Vdd) to ground (e.g., rail-to-rail swing) at a faster rate than a read port in a conventional SRAM register file to improve read performance.

Referring to FIG. 2, another particular aspect of the SRAM register file 100 that includes the silicon germanium read port is shown. In a particular aspect, the SRAM register file 100 may correspond to an 8T SRAM register file (e.g., an 8T bit cell). The SRAM register file 100 may include the write port 132 coupled to the read port 102.

The write port 132 includes a PMOS transistor 208 (e.g., a pull-up transistor) having a SiGe channel and another PMOS transistor 210 (e.g., a pull-up transistor) having a SiGe channel. The write port 132 also includes an NMOS transistor 212 (e.g., a pull-down transistor) and another NMOS transistor 214. In a particular aspect, the transistors 208-214 may correspond to a pair of cross-coupled inverters (or a latch) used to store a data value. To illustrate, the PMOS transistor 208 and the NMOS transistor 212 may correspond to a first inverter, and the PMOS transistor 210 and the NMOS transistor 214 may correspond to a second inverter.

A gate of the PMOS transistor 208 may be coupled to a gate of the NMOS transistor 212, and a drain of the PMOS transistor 208 may be coupled to a drain of the NMOS transistor 212. A source of the PMOS transistor 208 may be coupled to a supply voltage (Vdd), and a source of the NMOS transistor 212 may be coupled to ground. Thus, if a logic high voltage level is applied to the gates of the PMOS transistor 208 and the NMOS transistor 212 (e.g., the input of the first inverter), the PMOS transistor 208 inhibits conduction and the NMOS transistor 212 conducts. The NMOS transistor 212 "pulls down" the voltage at the drains of the PMOS transistor 208 and the NMOS transistor 212 (e.g., the output of the first inverter) to ground. Thus, the first inverter inverts the logic high voltage level at the input to a logic low voltage level at the output. If a logic low voltage level is applied to the gates of the PMOS transistor 208 and the NMOS transistor 212, the NMOS transistor 212 inhibits conduction and the PMOS transistor 208 conducts. The PMOS transistor 208 "pulls up" the voltage at the drains of the PMOS transistor 208 and the NMOS transistor 212 to the supply voltage (Vdd). Thus, the first inverter inverts the logic low voltage level at the input to a logic high voltage level at the output.

A gate of the PMOS transistor 210 may be coupled to a gate of the NMOS transistor 214, and a drain of the PMOS transistor 210 may be coupled to a drain of the NMOS transistor 214. A source of the PMOS transistor 210 may be coupled to a supply voltage (Vdd), and a source of the NMOS transistor 214 may be coupled to ground. Thus, if a logic high voltage level is applied to the gates of the PMOS transistor 210 and the NMOS transistor 214 (e.g., the input of the second inverter), the PMOS transistor 210 inhibits conduction and the NMOS transistor 214 conducts. The NMOS transistor 214 "pulls down" the voltage at the drains of the PMOS transistor 210 and the NMOS transistor 214 (e.g., the output of the second inverter) to ground. Thus, the second inverter inverts the logic high voltage level at the input to a logic low voltage level at the output. If a logic low voltage level is applied to the gates of the PMOS transistor 210 and the NMOS transistor 214, the NMOS transistor 214 inhibits conduction and the PMOS transistor 210 conducts. The PMOS transistor 210 "pulls up" the voltage at the drains of the PMOS transistor 210 and the NMOS transistor 214 to the supply voltage (Vdd). Thus, the second inverter inverts the logic low voltage level at the input to a logic high voltage level at the output.

The write port 132 may also include an NMOS transistor 216 (e.g., a pass gate) and an NMOS transistor 218 (e.g., a pass gate). Gates of the NMOS transistors 216, 218 may be coupled to a write word line (WWL). A drain of the NMOS transistor 216 may be coupled to a bit line (BL), and a drain of the NMOS transistor 218 may be coupled to a complementary bit line (BLb). A source of the NMOS transistor 216 may be coupled to the output of the first inverter (e.g., drains of the PMOS transistor 208 and the NMOS transistor 212) and to the input of the second inverter (e.g., gates of the PMOS transistor 210 and the NMOS transistor 214). A source of the NMOS transistor 218 may be coupled to the output of the second inverter (e.g., drains of the PMOS transistor 210 and the NMOS transistor 214) and to the input of the first inverter (e.g., gates of the PMOS transistor 208 and the NMOS transistor 212).

During a write operation, a logic high voltage level may be provided to the write word line (WWL) to turn on the NMOS transistors 216, 218. A logic value may be provided to the bit lines (BL, BLb) to write a data value into the latch (e.g., the cross-coupled inverters). For example, to write a logical "1" data value into the latch, a logic high voltage level may be provided to the bit line (BL). The conducting NMOS transistor 216 may provide the logic high voltage level to the output of the first inverter and to the input of the second inverter. To write a logical "0" data value into the latch, a logic low voltage level may be provided to the bit line (BL). The conducting NMOS transistor 216 may provide the logic low voltage level to the output of the first inverter and to the input of the second inverter. Alternatively, or in addition, to write a logical "1" data value into the latch, a logic low voltage level may be provided to the complementary bit line (BLb). To write a logical "0" data value into the latch, a logic high voltage level may be provided to the complementary bit line (BLb). In a particular aspect, a logic low voltage level may be provided to the write word line (WWL) to "hold" or store the data value in the latch.

During a read operation (e.g., a sensing operation), the read port 102 may be configured to sense whether the data value stored in the latch represents a logical "0" data value or a logical "1" data value. For example, the gate of the PMOS transistor 106 may be coupled to the output of the first inverter and to the input of the second inverter. The read bit line (RBL) may be pre-charged to a logic high voltage level and the read word line (RWL) may be coupled to ground (e.g., a logic low voltage level) to turn on the PMOS transistor 104.

If the data value stored in the latch of the write port 132 is a logical "1" (e.g., a logic high voltage level is provided to the gate of the PMOS transistor 106), the PMOS transistor 106 may inhibit conduction and the read bit line (RBL) remains in a pre-charged state (e.g., the read bit line (RBL) is not discharged). If the data value stored in the latch of the write port 132 is a logical "0" (e.g., a logic low voltage level is provided to the gate of the PMOS transistor 106), the PMOS transistor 106 may conduct and the read bit line (RBL) is discharged.

The SRAM register file 100 of FIG. 2 may improve read performance compared to a conventional SRAM register file. For example, the PMOS transistors 104, 106 (e.g., SiGe channel transistors) may have increased carrier mobility as compared to an SRAM register file having silicon channel n-type metal oxide semiconductor (NMOS) transistors. For example, the carrier mobility of the PMOS transistors 104, 106 may be approximately 10% to 20% higher than the carrier mobility of the silicon channel NMOS transistors. The increased carrier mobility of the PMOS transistors 104, 106 enables the read bit line (RBL) to discharge from the "pre-charged" level (Vdd) to ground (e.g., rail-to-rail swing) at a faster rate than a read port in a conventional SRAM register file to improve read performance.

Additionally, using the PMOS transistors 208, 210 may provide a guard band against negative bias temperature instability (NBTI) that degrades cell read stability. For example, the stronger channels (e.g., the SiGe channels) in the PMOS transistors 208, 210 may improve stability during a hold operation (e.g., the pull-up to the supply voltage (Vdd) may be stronger than the pull-up for PMOS transistors having silicon channels). Thus, temperature conditions may have a reduced impact on a stored data value during the holding state.

Figure 3:
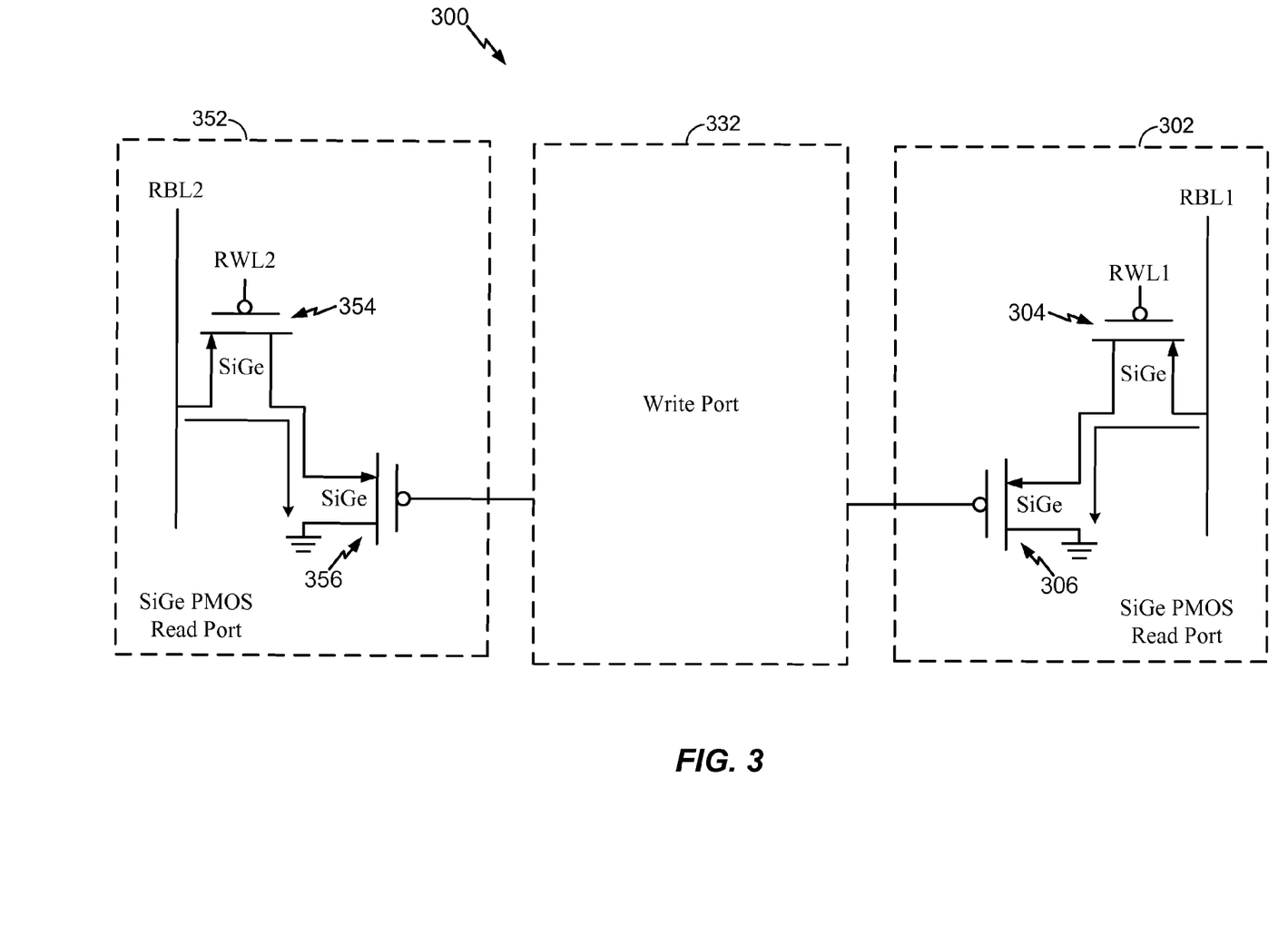
FIG. 3 is a diagram of a particular illustrative aspect of a SRAM register file that includes two silicon germanium read ports.

Referring to FIG. 3, a particular illustrative aspect of a SRAM register file 100 that includes two silicon germanium read ports is shown. In a particular aspect, the SRAM register file 100 may correspond to a 10-transistor (10T) SRAM register file (e.g., a 10T bit cell). The SRAM register file 100 may include a write port 332, a first read port 302 coupled to the write port 332, and a second read port 352 coupled to the write port 332.

Figure 4:
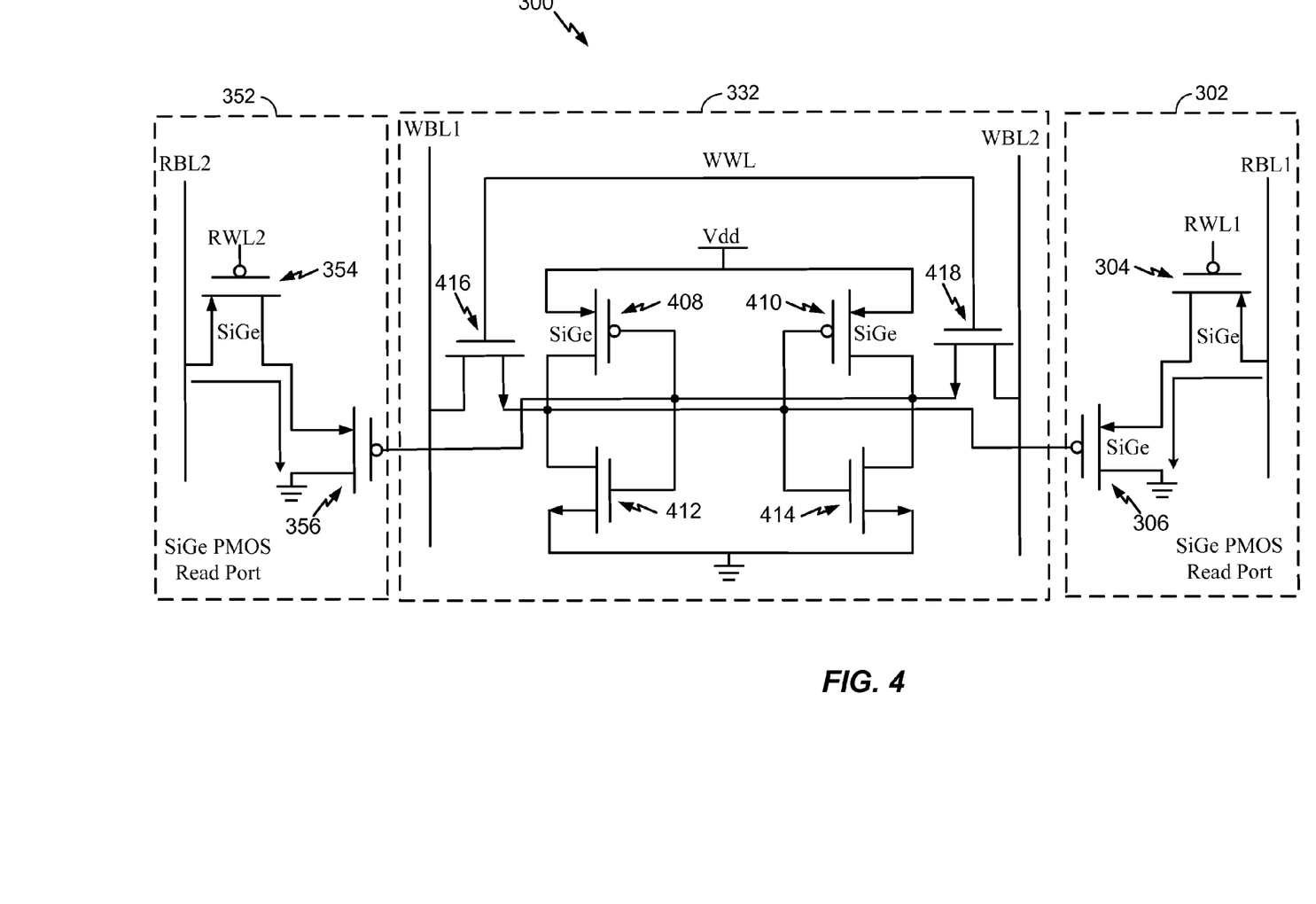
FIG. 4 is a diagram of another particular illustrative aspect of the SRAM register file of FIG. 3.

The write port 332 may include a pair of cross-coupled inverters (e.g., a latch), as described with respect to FIG. 4, to store a data value. For example, the write port 332 may store a data value having a logic low voltage level (e.g., a logical "0" data value) or a data value having a logic high voltage level (e.g., a logical "1" data value).

The first read port 302 may be configured to read (e.g., sense) the data value stored at the write port 332. In a particular aspect, the first read port 302 may be a SiGe PMOS read port. For example, the first read port 302 may include a PMOS transistor 304 (e.g., a pass gate) having a SiGe channel coupled to another PMOS transistor 306 having a SiGe channel. A gate of the PMOS transistor 304 may be coupled to a first read word line (RWL1) and a source of the PMOS transistor 304 may be coupled to a first read bit line (RBL1). A source of the PMOS transistor 306 may be coupled to a drain of the PMOS transistor 304, and a drain of the PMOS transistor 306 may be coupled to ground.

The second read port 352 may be configured to read (e.g., sense) the data value stored at the write port 332. In a particular aspect, the second read port 352 may be a SiGe PMOS read port. For example, the second read port 352 may include a PMOS transistor 354 (e.g., a pass gate) having a SiGe channel coupled to another PMOS transistor 356 having a SiGe channel. A gate of the PMOS transistor 354 may be coupled to a second read word line (RWL2) and a source of the PMOS transistor 354 may be coupled to a second read bit line (RBL2). A source of the PMOS transistor 356 may be coupled to a drain of the PMOS transistor 354, and a drain of the PMOS transistor 356 may be coupled to ground.

Each read port 302, 352 may operate in a substantially similar manner as the read port 102 of FIG. 1. Using multiple read ports 302, 352 may enable enhanced single-ended read operations.

The SRAM register file 300 of FIG. 3 may improve read performance compared to a conventional SRAM register file. For example, the PMOS transistors 304, 306, 354, 356 (e.g., SiGe channel transistors) may have increased carrier mobility as compared to an SRAM register file having silicon channel NMOS transistors. For example, the carrier mobility of the PMOS transistors 304, 306, 354, 356 may be approximately 10% to 20% higher than the carrier mobility of the silicon channel NMOS transistors. The increased mobility of the PMOS transistors 304, 306, 354, 356 enables the read bit lines (RBL1, RBL2) to discharge from the "pre-charged" level (Vdd) to ground (e.g., rail-to-rail swing) at a faster rate than a read port in a conventional SRAM register file to improve read performance.

Referring to FIG. 4, another particular aspect of the SRAM register file 300 that includes the silicon germanium read port is shown. In a particular aspect, the SRAM register file 300 may correspond to a 10T SRAM register file (e.g., a 10T bit cell). The SRAM register file 300 may include the write port 332, the first read port 302, and the second read port 352.

The write port 332 includes a PMOS transistor 408 (e.g., a pull-up transistor) having a SiGe channel and another PMOS transistor 410 (e.g., a pull-up transistor) having a SiGe channel. The write port 332 also includes an NMOS transistor 412 (e.g., a pull-down transistor) and another NMOS transistor 414. In a particular aspect, the transistors 408-414 may correspond to a pair of cross-coupled inverters (or a latch) used to store a data value. To illustrate, the PMOS transistor 408 and the NMOS transistor 412 may correspond to a first inverter, and the PMOS transistor 410 and the NMOS transistor 414 may correspond to a second inverter. The write port 332 may also include an NMOS transistor 416 (e.g., a pass gate) and an NMOS transistor 418 (e.g., a pass gate). Gates of the NMOS transistors 416, 418 may be coupled to a write word line (WWL). A drain of the NMOS transistor 416 may be coupled to a first write bit line (WBL1), and a drain of the NMOS transistor 418 may be coupled to a second write bit line (WBL2). The write port 332 may operate in a substantially similar manner as the write port 132 of FIG. 2.

During a read operation (e.g., a sensing operation), the first read port 302 and the second read port 352 may be configured to sense whether the data value stored in the write port 332 represents a logical "0" data value or a logical "1" data value. For example, the read ports 302, 352 may operate in a substantially similar manner as the read port 102 of FIG. 1.

The SRAM register file 300 of FIG. 4 may improve read performance compared to a conventional SRAM register file. For example, the PMOS transistors 304, 306, 354, 356 (e.g., SiGe channel transistors) may have increased carrier mobility as compared to an SRAM register file having silicon channel NMOS transistors. For example, the carrier mobility of the PMOS transistors 304, 306, 354, 356 may be approximately 10% to 20% higher than the carrier mobility of the silicon channel NMOS transistors. The increased mobility of the PMOS transistors 304, 306, 354, 356 enables the read bit lines (RBL1, RBL2) to discharge from the "pre-charged" level (Vdd) to ground (e.g., rail-to-rail swing) at a faster rate than a read port in a conventional SRAM register file to improve read performance. Additionally, using the PMOS transistors 408, 410 may provide a guard band against NBTI that degrades cell read stability.

Figure 5:
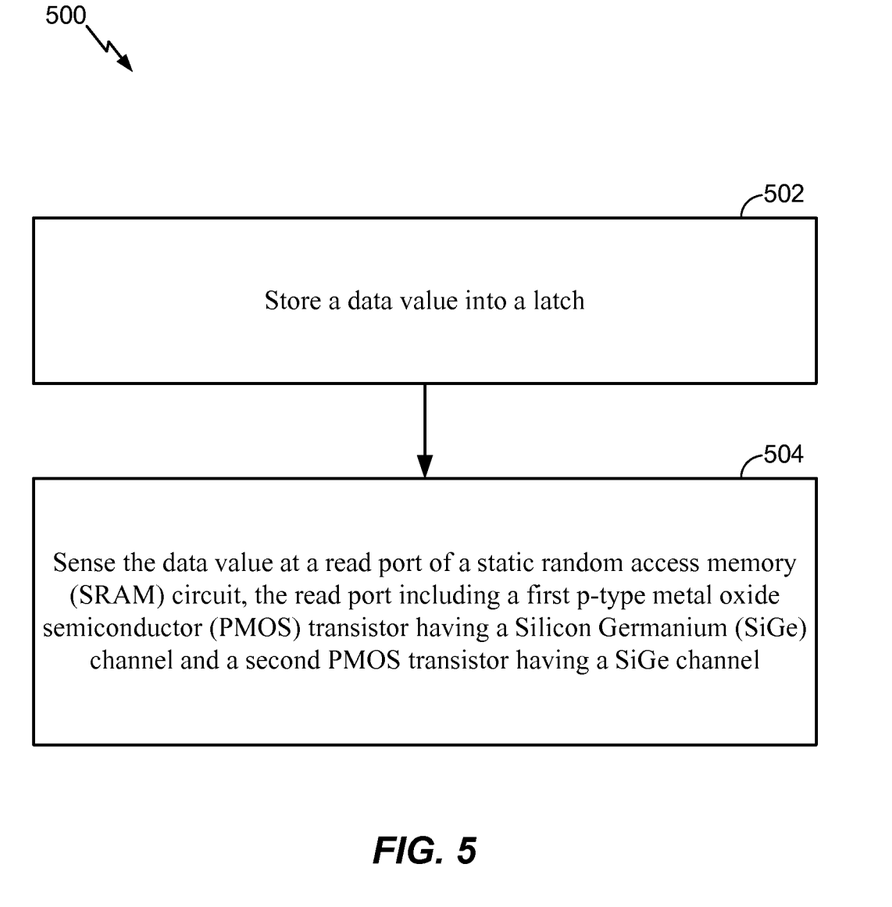
FIG. 5 is a flowchart of another particular illustrative aspect of a method for sensing data with silicon germanium read port.

Referring to FIG. 5, a flowchart of a particular illustrative aspect of a method 500 for sensing data with silicon germanium read port is shown. The method 500 may be performed at the SRAM register file 100 of FIGS. 1-2, the SRAM register file 300 of FIGS. 3-4, or any combination thereof.

The method 500 includes storing a data value into a latch, at 502. For example, referring to FIG. 2, a logic value (e.g., a data value) may be provided to one of the bit lines (BL, BLb) to write a data value into the latch (e.g., the cross-coupled inverters). To write a logical "1" data value into the latch, a logic high voltage level may be provided to the bit line (BL). The conducting NMOS transistor 216 may provide the logic high voltage level to the output of the first inverter and to the input of the second inverter. To write a logical "0" data value into the latch, a logic low voltage level may be provided to the bit line (BL). The conducting NMOS transistor 216 may provide the logic low voltage level to the output of the first inverter and to the input of the second inverter. In a particular aspect, a logic low voltage level may be provided to the write word line (WWL) to "hold" or store the data value in the latch.

The data value may be sensed at a read port of a static random access memory (SRAM) circuit, at 504. The read port may include a first PMOS transistor having a SiGe channel and a second PMOS transistor having a SiGe channel. For example, referring to FIG. 2, the read port 102 may sense whether the data value stored in the latch represents a logical "0" data value or a logical "1" data value. For example, the gate of the PMOS transistor 106 may be coupled to the output of the first inverter and to the input of the second inverter. The read bit line (RBL) may be pre-charged to a logic high voltage level and the read word line (RWL) may be coupled to ground (e.g., a logic low voltage level) to turn on the PMOS transistor 104. If the data value stored in the latch of the write port 132 is a logical "1" (e.g., a logic high voltage level is provided to the gate of the PMOS transistor 106), the PMOS transistor 106 may inhibit conduction and the read bit line (RBL) remains in a pre-charged state (e.g., the read bit line (RBL) does not discharge). If the data value stored in the latch of the write port 132 is a logical "0" (e.g., a logic low voltage level is provided to the gate of the PMOS transistor 106), the PMOS transistor 106 may conduct and the read bit line (RBL) is discharged.

The method 500 of FIG. 5 may improve read performance compared to a conventional SRAM register file. For example, the PMOS transistors 104, 106 (e.g., SiGe channel transistors) may have increased carrier mobility as compared to an SRAM register file having silicon channel NMOS transistors. For example, the carrier mobility of the PMOS transistors 104, 106 may be approximately 10% to 20% higher than the carrier mobility of the silicon channel NMOS transistors. The increased mobility of the PMOS transistors 104, 106 enables the read bit line (RBL) to discharge from the "pre-charged" level (Vdd) to ground (e.g., rail-to-rail swing) at a faster rate than a read port in a conventional SRAM register file to improve read performance.

Figure 6:
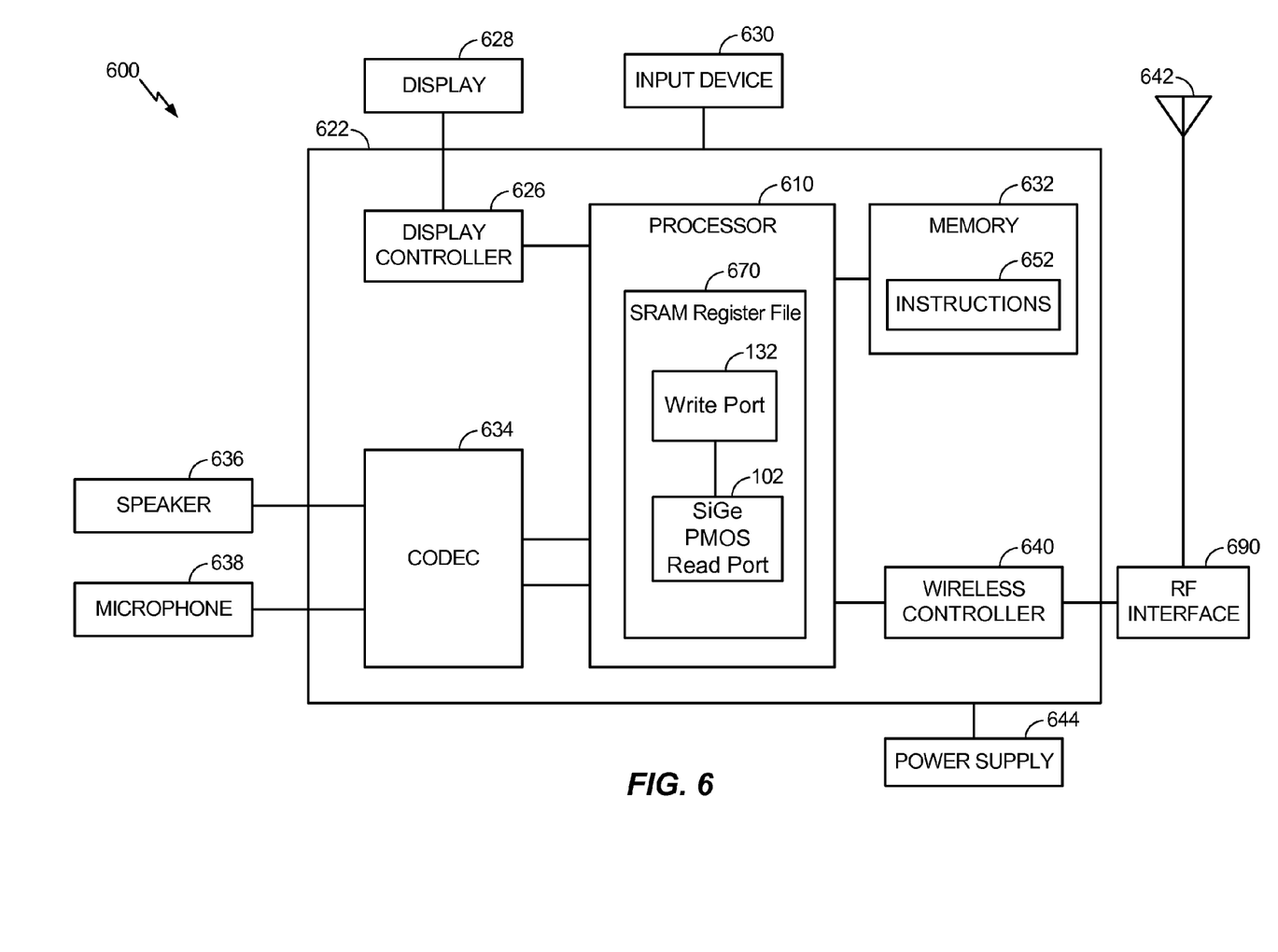
FIG. 6 is a block diagram of a wireless device including a SRAM register file that includes a silicon germanium read port.

Referring to FIG. 6, a block diagram of a wireless device 600 including a SRAM register file that includes a silicon germanium read port is shown. The wireless device 600 includes a processor 610, such as a digital signal processor (DSP), coupled to a memory 632.

The memory 632 may be a non-transitory processor-readable storage medium that includes instructions 652. The instruction 652 may be executed by a processor, such as the processor 610. The processor 610 may include an SRAM register file 670. The SRAM register file 670 may include the write port 132 of FIG. 1 and the read port 102 of FIG. 1 (e.g., a SiGe read port). Components of the processor 610 may be configured to perform the method 500 of FIG. 5. For example, the write port 132 may be configured to store a data value into a latch, and the read port 102 may be configured to sense the data value. The read port 102 may include a first PMOS transistor having a SiGe channel and a second PMOS transistor having a SiGe channel. Although the write port 132 and the read port 102 are shown in the SRAM register file 670 of the processor 610, in other embodiments, the write port 132 and the read port 102 may be in other components of the wireless device 600, such as the display controller 626, the memory 632, the CODEC 634, the wireless controller 640, etc.

The wireless device 600 may also include a display controller 626 that is coupled to the processor 610 and to a display 628. A coder/decoder (CODEC) 634 can also be coupled to the processor 610. A speaker 636 and a microphone 638 can be coupled to the CODEC 634 and to the processor 610. FIG.

6 also indicates that a wireless controller 640 can be coupled to the processor 610. The wireless controller 640 may also be coupled to an antenna 642 via a radio frequency (RF) interface 690.

In a particular aspect, the processor 610, the display controller 626, the memory 632, the CODEC 634, and the wireless controller 640 are included in a system-in-package or system-on-chip device 622. In a particular aspect, an input device 630 and a power supply 644 are coupled to the system-on-chip device 622. Moreover, in a particular aspect, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller.

In conjunction with the described aspects, a static random access memory (SRAM) circuit includes means for storing data. For example, the means for storing data may include the write port 132 of FIGS. 1-2 and 5, the write port 332 of FIGS. 3-4, one or more other devices, circuits, modules, or any combination thereof.

The SRAM circuit may also include means for means for sensing data coupled to the means for writing data. The means for sensing data may include a read bit line, a first PMOS transistor having a silicon germanium (SiGe) channel, and a second PMOS transistor having a SiGe channel. The second PMOS transistor may be coupled to the first PMOS transistor, and the first PMOS transistor and the second PMOS transistor may be configured to discharge the read bit line. For example, the means for sensing data may include the read port 102 of FIGS. 1-2 and 5, the first read port 302 of FIGS. 3-4, the second read port 352 of FIGS. 3-4, one or more other devices, circuits, modules, or any combination thereof.

Those of skill would further appreciate that the various illustrative logical blocks, configurations, modules, circuits, and algorithm steps described in connection with the aspects disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A static random access memory (SRAM) circuit comprising:
   a write port; and
   a read port coupled to the write port, the read port comprising:
      a first p-type metal oxide semiconductor (PMOS) transistor having a first silicon germanium (SiGe) channel; and
      a second PMOS transistor having a second SiGe channel, wherein the second PMOS transistor is coupled between the first PMOS transistor and a ground voltage,
      wherein the first PMOS transistor and the second PMOS transistor are configured to discharge a read bit line.

2. The SRAM circuit of claim 1, wherein the write port and the read port are included in an 8-transistor bit cell.

3. The SRAM circuit of claim 1, wherein a source of the first PMOS transistor is coupled to the read bit line, and wherein a gate of the first PMOS transistor is coupled to a read word line.

4. The SRAM circuit of claim 1, wherein a source of the second PMOS transistor is coupled to a drain of the first PMOS transistor, and wherein a drain of the second PMOS transistor is coupled to ground.

5. The SRAM circuit of claim 1, further comprising a second read port coupled to the write port, the second read port comprising:
   a second read bit line;
   a third PMOS transistor having a third SiGe channel; and
   a fourth PMOS transistor having a fourth SiGe channel, wherein the fourth PMOS transistor is coupled to the third PMOS transistor.

6. The SRAM circuit of claim 5, wherein the write port and the read port are included in a 10-transistor bit cell.

7. The SRAM circuit of claim 5, wherein the third PMOS transistor and the fourth PMOS transistor are configured to discharge the second read bit line.

8. The SRAM circuit of claim 7, wherein a source of the third PMOS transistor is coupled to the second read bit line, and wherein a gate of the third PMOS transistor is coupled to a second read word line.

9. The SRAM circuit of claim 7, wherein a source of the fourth PMOS transistor is coupled to a drain of the third PMOS transistor, and wherein a drain of the fourth PMOS transistor is coupled to ground.

10. The SRAM circuit of claim 1, wherein the write port comprises a latch, the latch comprising:
    a first inverter having an input coupled to a gate of the second PMOS transistor; and
    a second inverter having an output coupled to the gate of the second PMOS transistor.

11. The SRAM circuit of claim 10, wherein the first inverter comprises:

a first n-type metal oxide semiconductor (NMOS) transistor, wherein a gate of the first NMOS transistor is coupled to the gate of the second PMOS transistor; and a fifth PMOS transistor having a fifth SiGe channel, wherein a gate of the fifth PMOS transistor is coupled to the gate of the second PMOS transistor.

12. The SRAM circuit of claim 11, wherein the second inverter comprises:
  a second NMOS transistor, wherein a drain of the second NMOS transistor is coupled to the gate of the second PMOS transistor; and
  a sixth PMOS transistor having a sixth SiGe channel, wherein a drain of the sixth PMOS transistor is coupled to the gate of the second PMOS transistor;
  wherein a gate of the second NMOS transistor is coupled to a gate of the sixth PMOS transistor.

13. The SRAM circuit of claim 12, wherein a source of the first NMOS transistor is coupled to a source of the second NMOS transistor, and wherein a source of the fifth PMOS transistor is coupled to a source of the sixth PMOS transistor.

14. A method comprising:
  storing a data value into a latch; and
  sensing the data value at a read port of a static random access memory (SRAM) circuit, the read port including a first p-type metal oxide semiconductor (PMOS) transistor having a first silicon germanium (SiGe) channel and a second PMOS transistor, wherein sensing the data value includes:
    pre-charging a read bit line coupled to a source of the first PMOS transistor, the read bit line pre-charged to a logic high voltage level; and
    biasing a gate of the first PMOS transistor with a logic low voltage level.

15. The method of claim 14, wherein the second PMOS transistor has a second SiGe channel.

16. The method of claim 14, wherein the read bit line discharges when the data value corresponds to the logic low voltage level.

17. The method of claim 14, wherein the read bit line remains charged when the data value corresponds to a logic high voltage level.

18. The method of claim 14, wherein the SRAM circuit is an 8-transistor bit cell.

19. The method of claim 14, wherein the SRAM circuit is a 10-transistor bit cell.

20. A non-transitory computer-readable medium comprising instructions that, when executed by a processor, cause the processor to perform operations comprising:
  storing a data value into a latch; and
  sensing the data value at a read port of a static random access memory (SRAM) circuit, the read port including a first p-type metal oxide semiconductor (PMOS) transistor having a first silicon germanium (SiGe) channel and a second PMOS transistor, wherein sensing the data value includes:
    pre-charging a read bit line coupled to a source of the first PMOS transistor, the read bit line pre-charged to a logic high voltage level; and
    biasing a gate of the first PMOS transistor with a logic low voltage level.

21. The non-transitory computer-readable medium of claim 20, wherein the second PMOS transistor has a second SiGe channel.

22. The non-transitory computer-readable medium of claim 20, wherein the SRAM circuit is an 8-transistor bit cell.

23. The non-transitory computer-readable medium of claim 20, wherein the SRAM circuit is a 10-transistor bit cell.

24. A static random access memory (SRAM) circuit comprising:
  means for storing data; and
  means for sensing data coupled to the means for storing data, the means for sensing data comprising:
    a first p-type metal oxide semiconductor (PMOS) transistor having a first silicon germanium (SiGe) channel; and
    a second PMOS transistor coupled to the first PMOS transistor,
    wherein the first PMOS transistor and the second PMOS transistor are configured to discharge a read bit line.

25. The SRAM circuit of claim 24, wherein the second PMOS transistor has a second SiGe channel.

26. The SRAM circuit of claim 24, wherein the means for storing data and the means for sensing data are included in an 8-transistor bit cell.

27. The SRAM circuit of claim 24, wherein the means for storing data and the means for sensing data are included in a 10-transistor bit cell.

* * * * *